US009853648B2

(12) United States Patent
Su et al.

(10) Patent No.: US 9,853,648 B2
(45) Date of Patent: Dec. 26, 2017

(54) COMPENSATION APPARATUS AND INDUCTOR-BASED APPARATUS

(71) Applicant: MEDIATEK Inc., Hsin-Chu (TW)

(72) Inventors: Richard Y. Su, Kaohsiung (TW); Yu-Li Hsueh, New Taipei (TW); Chih-Hsien Shen, Zhubei (TW); Chao-Ching Hung, Changhua (TW); Yi-Chien Tsai, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 94 days.

(21) Appl. No.: 14/737,619

(22) Filed: Jun. 12, 2015

(65) Prior Publication Data

US 2016/0118903 A1 Apr. 28, 2016

Related U.S. Application Data

(60) Provisional application No. 62/066,955, filed on Oct. 22, 2014.

(51) Int. Cl.
*H03L 1/02* (2006.01)
*H03L 7/099* (2006.01)

(52) U.S. Cl.
CPC ............ *H03L 7/099* (2013.01); *H03L 1/022* (2013.01)

(58) Field of Classification Search
CPC ................................ H03L 7/099; H03L 1/022
USPC ............................................ 331/176, 117 FE
See application file for complete search history.

(56) References Cited

U.S. PATENT DOCUMENTS

2006/0139138 A1* 6/2006 Watanabe ............ H01F 17/0006
336/200
2006/0255872 A1* 11/2006 Hino .................... H03B 5/1293
331/177 V

OTHER PUBLICATIONS

Ates, et al.: "Fully Integrated Frequency Reference With 1.7 ppm Temperature Accuracy Within 0-80° C."; IEEE Journal of Solid-State Circuits, vol. 48, No. 11, Nov. 2013; pp. 2850-2859.

* cited by examiner

*Primary Examiner* — Joseph Chang
(74) *Attorney, Agent, or Firm* — McClure, Qualey & Rodack, LLP

(57) ABSTRACT

A compensation apparatus including a primary circuit and a compensation circuit is provided. The primary circuit provides a first voltage, a second voltage, and a first current flowing through a first inductor. The primary circuit includes the first inductor and a function circuit generating an input signal. The first inductor is coupled between a first terminal with the first voltage and a second terminal with the second voltage. The compensation circuit includes a second inductor and a current source circuit. The second inductor is coupled between a third terminal with a third voltage and a fourth terminal with a fourth voltage. The current source circuit outputs a second current flowing through the second inductor. The current source circuit adjusts a frequency of the input signal. The primary circuit and the compensation circuit are coupled via the first inductor and the second inductor.

25 Claims, 6 Drawing Sheets

COMPENSATION APPARATUS AND INDUCTOR-BASED APPARATUS

This application claims the benefit of U.S. provisional patent application No. 62/066,955, filed Oct. 22, 2014, the disclosure of which is incorporated by reference herein in its entirety.

BACKGROUND

Technical Field

The disclosure relates in general to a compensation apparatus and an inductor-based apparatus, and more particularly to a compensation apparatus and an inductor-based apparatus with temperature compensation function.

Description of the Related Art

Phase-locked loop (hereinafter, PLL) circuits are widely used for the distribution of clocks on microprocessors, digital signal processors (DSPs), field programmable gate arrays (FPGAs), etc. In a PLL circuit, a voltage-controlled oscillator (hereinafter, VCO) is the key analogue block to determine the frequency stability and the jitter performance.

In current technology, LC VCO is a widely used scheme for CMOS based VCO design. The oscillation frequency of a LC VCO is determined by the resonator inductor and capacitor. However, the oscillation frequency of the LC VCO is temperature dependent. Factors such as changes of inductance, changes of Q factor of the inductance, swing amplitude of the VCO itself, or non-linear capacitance etc. cause variations of the oscillation frequency of LC VCO over temperature. Consequentially, techniques for temperature compensation should be utilized to improve the accuracy of the oscillation frequency.

Techniques for compensating for the effects of temperature change on VCO frequency are developed. The conventional temperature compensation circuits utilize varactors to provide a negative temperature coefficient (TC) to the LC VCO. With the negative temperature coefficient, the frequency drift caused by temperature variation is eliminated. However, the varactors may occupy significant silicon area. Therefore, a more economic approach for TC compensation is required.

SUMMARY

The disclosure is directed to a compensation apparatus and an inductor-based apparatus for compensating frequency of an input signal. The input signal is outputted by an oscillator such as a voltage-controlled oscillator (VCO), a digitally controlled oscillator (DCO) or the like. The oscillator is a portion of a primary circuit, whose inductance and resistance are compensated by a current flowing through a compensation circuit. Consequentially, frequency of the input signal is adjusted.

According to one embodiment, a compensation apparatus including a primary circuit and a compensation circuit is provided. The primary circuit provides a first voltage, a second voltage, and a first current flowing through the first inductor. The primary circuit includes a function circuit generating an input signal and a first inductor. The first inductor is coupled between a first terminal with the first voltage and a second terminal with the second voltage. The compensation circuit includes a second inductor and a current source circuit. The second inductor is coupled between a third terminal with a third voltage and a fourth terminal with a fourth voltage. The current source circuit outputs a second current flowing through the second inductor. The current source circuit adjusts a frequency of the input signal. The primary circuit and the compensation circuit are coupled via the first inductor and the second inductor.

According to another embodiment, an inductor-based apparatus for adjusting frequency of an input signal is provided. The inductor-based apparatus includes a first inductor, a second inductor and a current source circuit. The first inductor is coupled between a first terminal with a first voltage and a second terminal with a second voltage. A first current flows through the first inductor. The second inductor is coupled between a third terminal with a third voltage and a fourth terminal with a fourth voltage. The current source circuit outputs a second current flowing through the second inductor to adjust a frequency of the input signal.

Figure 1:
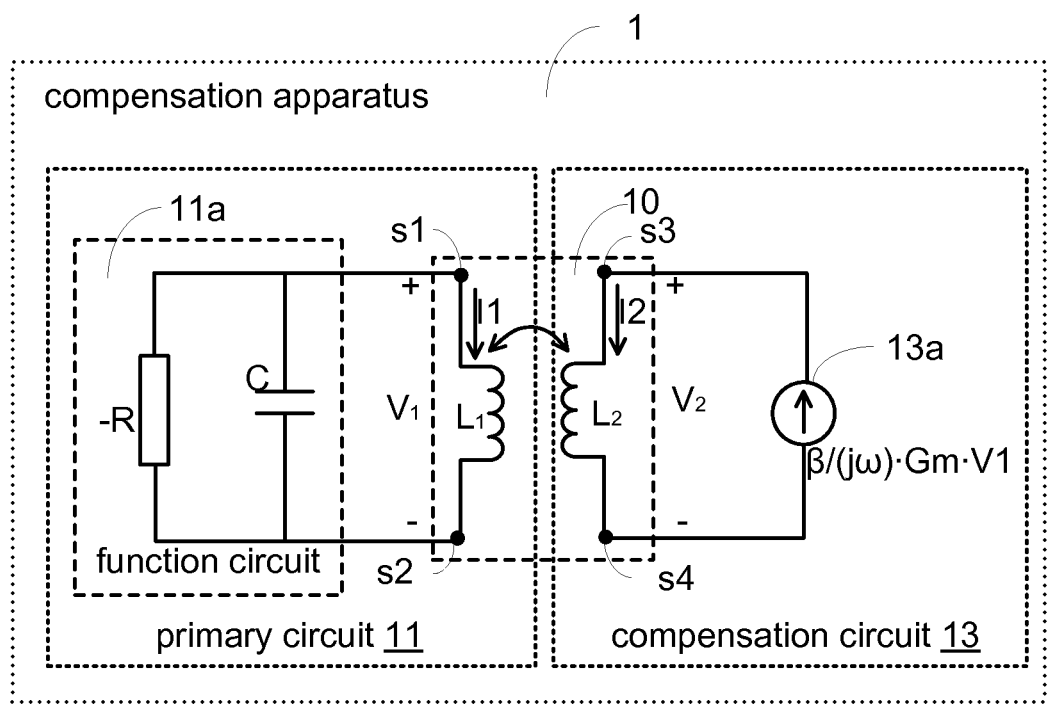
FIG. 1 is a schematic diagram illustrating the primary circuit and the compensation circuit placed in the transformer-like arrangement.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The present disclosure directly improves the stability of oscillation frequency of an output of an oscillator, such as the LC VCO, an DCO or the like. Instead of providing a compensation circuit having the negative temperature coefficient, the compensation circuit according to the present disclosure shrinks a value of the temperature coefficient by reducing deviation of the oscillation frequency.

FIG. 1 is a schematic diagram of a compensation apparatus 1 according to an embodiment of the present disclosure. The compensation apparatus 1 includes a primary circuit 11 and a compensation circuit 13. The primary circuit 11 and the compensation circuit 13 are coupled via a transformer 10 including a primary inductor $L_1$ and a compensation inductor $L_2$. The primary circuit 11 includes the primary inductor $L_1$ and a function circuit 11a. The function circuit 11a includes a negative resistor −R and a capacitor C. The primary inductor $L_1$ is coupled to the function circuit 11a through a first terminal s1 and a second primary terminal s2. The first terminal s1 is with a first voltage, and the second terminal s2 is with a second voltage. The voltage difference between the first terminal s1 and the second terminal s2 is defined as a first voltage difference $V_1$. A first current $I_1$ flows through the primary inductor $L_1$.

The compensation circuit 13 includes a compensation inductor $L_2$ and a current source circuit 13a, and the current source circuit 13a outputs a current equal to $$\left(\frac{\beta}{j\omega} \cdot Gm \cdot V_1\right)$$

flowing through the compensation inductor $L_2$. The Gm represents the large signal transconductance, and represents a first amplifying parameter. The compensation inductor $L_2$ is coupled between a third terminal s3 with a third voltage, and a fourth terminal s4 with a fourth voltage. The voltage difference between the third terminal s3 and the fourth terminal s4 is defined as a second voltage difference $V_2$. The current flowing through the compensation inductor $L_2$ is defined as a second current $I_2$. The relative position between the primary inductor $L_1$ and the compensation inductor L2 is defined as spacing s, and the mutual inductance between the primary inductor L1 and the compensation inductor $L_2$ is defined as M.

In FIG. 1, the first voltage difference $V_1$ and the second voltage difference $V_2$ can be represented in equation (1).

$$\begin{cases} V_1 = sL_1 I_1 + sM I_2 \\ V_2 = sM I_1 + sL_2 I_2 \end{cases} \quad \text{equation (1)}$$

As the first current $I_1$ flows through the primary inductor L1, variance of the first current $I_1$ creates a varying magnetic field on the secondary inductor L2 and the varying magnetic field causes changes of the second current $I_2$. Furthermore, the first current $I_1$ is determined by the first voltage difference $V_1$. Consequentially, the second current $I_2$ is related to the first voltage difference $V_1$ and can be represented as shown in equation (2). In equation (2), $\beta$ represents a second amplifying parameter, Gm represents the large signal transconductance, and j is the imaginary unit.

$$I_2 = \frac{\beta}{j\omega} \cdot G_m \cdot V_1 \quad \text{equation (2)}$$

According to equation (1) and equation (2), the first voltage difference $V_1$ can be further represented as equation (3).

$$V_1 = \frac{sL_1 I_1}{(1-\beta \cdot M \cdot G_m)} \quad \text{equation (3)}$$

A simplified equation, $x=y\cdot(1+z)^{-1} \approx y\cdot(1-z)$ is valid if $z\ll 1$. Since $(\beta \cdot G_m \cdot M) \ll 1$ in equation (3), the first voltage difference $V_1$ shown in equation (3) can be simplified and represented in equation (4).

$$V_1 \approx s \cdot L_1 (1+\beta \cdot M \cdot G_m) \cdot I_1 \quad \text{equation (4)}$$

According to equation (4), the effective inductance of the primary inductor $L_1$ can be defined as $L_1(1-\beta \cdot M \cdot G_m)$ As $s \cdot L_1(1+\beta \cdot M \cdot G_m)$ is imaginary, and the transconductance $G_m$ changes with temperature, the effective inductance of the primary inductor $L_1$ can be used for compensating the frequency drift in accordance with temperature change.

In addition, by changing the second current $I_2$, the impedance looking into the primary circuit 11 will change accordingly. Change of the impedance looking into the primary circuit 11 is represented as equation (5). In equation (5), w is the oscillation frequency.

$$V_1 = j\omega(L_1 \cdot I_1 + M \cdot I_2) \quad \text{equation (5)}$$

The second current $I_2$ can be represented in parameters of the first voltage difference $V_1$. That is, $I_2 = \gamma \cdot V_1 - j \cdot \kappa \cdot V_1$. The coefficients of the first voltage difference $V_1$ are further defined as a trans-conductance $\gamma$ and a trans-susceptance $\kappa$. Therefore, equation (5) can be represented as equation (6).

$$\begin{aligned}V_1 &= j\omega(L_1 \cdot I_1 + M \cdot I_2) \quad \text{equation (6)}\\ &= j\omega \cdot L_1 \cdot I_1 + j\omega \cdot M \cdot (\gamma \cdot V_1 - j \cdot \kappa \cdot V_1)\\ &= j\omega \cdot L_1 \cdot I_1 + j\omega \cdot M \cdot \gamma \cdot V_1 + \omega \cdot M \cdot \kappa \cdot V_1\end{aligned}$$

Furthermore, the first voltage difference $V_1$ can be represented in equation (7).

$$V_1 = \frac{j\omega \cdot L_1 \cdot I_1}{1-(j\omega \cdot M \cdot \gamma + \omega \cdot M \cdot \kappa)} \quad \text{equation (7)}$$

It is assumed, $j\omega \cdot M \cdot \gamma \ll 1$ and $\omega \cdot M \cdot \kappa \ll 1$. Therefore, the relationship between the first voltage difference $V_1$ and the first current $I_1$ can be further simplified as equation (8).

$$\begin{aligned}V_1 &\approx j\omega \cdot L_1 \cdot I_1 [1 + (j\omega \cdot M \cdot \gamma + \omega \cdot M \cdot \kappa)] \quad \text{equation (8)}\\ &= j\omega \cdot L_1 \cdot I_1 - \omega^2 \cdot L_1 \cdot I_1 \cdot M \cdot \gamma + j\omega^2 \cdot L_1 \cdot I_1 \cdot M \cdot \gamma\\ &= j\omega \cdot L_1(1+\omega \cdot M \cdot \gamma)\cdot I_1 - \omega^2 \cdot M \cdot \gamma \cdot L_1 \cdot I_1\end{aligned}$$

According to equation (8), the coefficient of the imaginary part of the first current $I_1$, that is $L_1(1+\omega \cdot M \cdot \gamma)$, can be considered as an inductance looking into the primary circuit 11. Similarly, the coefficient of the real part of the first current $I_1$ that is $(-\omega^2 \cdot m \cdot \gamma \cdot L_1)$, can be considered as a negative resistance looking into the primary circuit 11.

Accordingly, the compensation circuit 13 is capable of influencing the first voltage difference $V_1$ through the inductance and the negative resistance as mentioned. The negative resistance and the inductance are further utilized to compensate the loss in the crystal and the non-linear capacitance.

Figure 2:
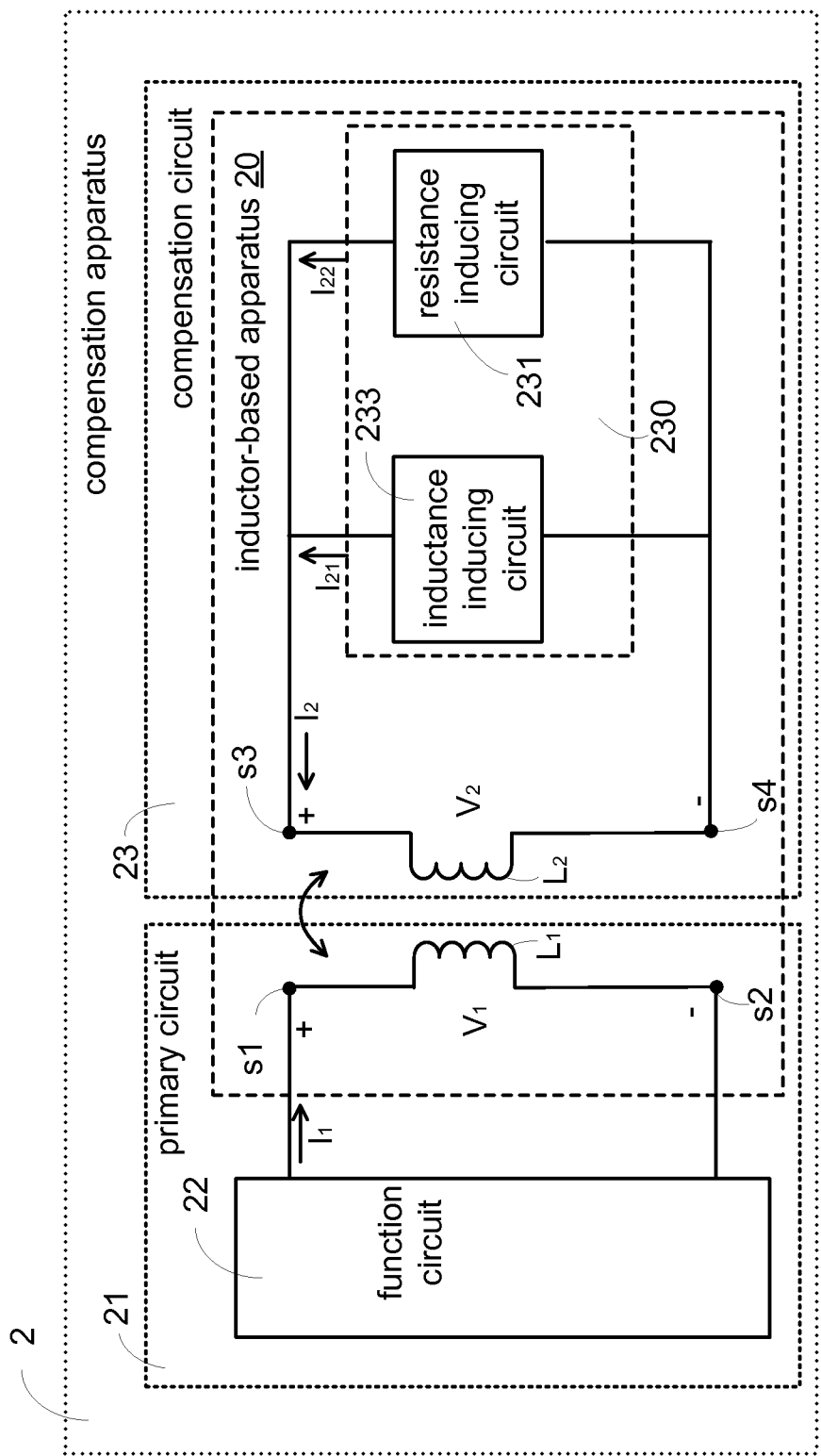
FIG. 2 is a schematic diagram illustrating the compensation circuit capable of adjusting resistance and inductance of the primary circuit.

FIG. 2 is a schematic diagram of a compensation apparatus 2 according to an embodiment of the present disclosure. The compensation apparatus 2 can be considered as a combination of a function circuit 22 and an inductor-based apparatus 20. The function circuit 22 generates an input signal outputted at the first terminal s1 and the second terminal s2. The inductor-based apparatus 20 includes a primary inductor L1, a compensation inductor L2, and a current source circuit 230.

Alternately, the compensation apparatus 2 can be considered as a combination of a compensation circuit 23 and a primary circuit 21. The compensation circuit 23 is capable of adjusting the negative resistance and inductance of the primary circuit 21 through the primary inductor $L_1$ and the compensation inductor $L_2$. The compensation circuit 23 includes the current source circuit 230 and the compensation inductor $L_2$.

In one embedment, the current source circuit 230 includes only one of the inductance inducing circuit 233 and the resistance inducing circuit 231. The inductance inducing circuit 233 may cause an inductance change of the primary circuit 21, and the resistance inducing circuit 231 causes a resistance change of the primary circuit 21. That is, the inductance inducing circuit 233 or the resistance inducing circuit 231 will correspondingly and independently cause an electric property change of the primary circuit 21. Furthermore, the compensation circuit 23 may also include plural inductance inducing circuits 233 and/or plural resistance inducing circuits 231.

Figure 3:
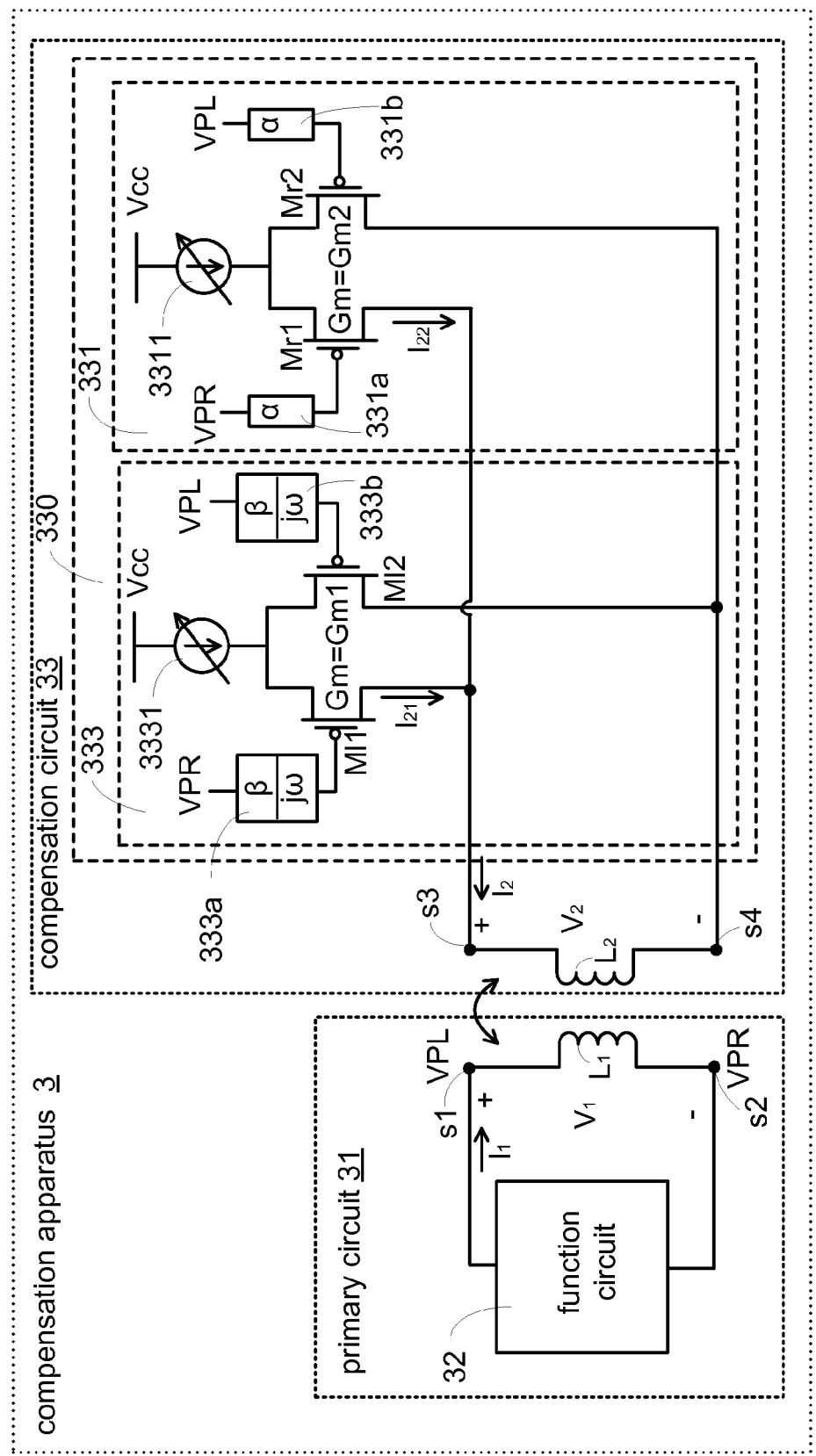
FIG. 3 is a schematic diagram illustrating the compensation circuit according to the present invention.

FIG. 3 is a schematic diagram of a compensation apparatus 3 according to an embodiment of the present disclosure. The compensation apparatus 3 includes a compensation circuit 33 and a primary circuit 31. The primary circuit 31 includes a function circuit 32 and the primary inductor $L_1$. The compensation circuit 33 includes the compensation inductor $L_2$ and a current source circuit 330. The current source circuit 30 further includes the resistance inducing circuit 331, and the inductance inducing circuit 333, which are electrically connected to the third terminal s3 and the fourth terminal s4 of the compensation inductor $L_2$ in parallel. The resistance inducing circuit 331 outputs a sub-current $I_{22}$ to the compensation inductor $L_2$, and the inductance inducing circuit 333 outputs a sub-current $I_{21}$ to the compensation inductor $L_2$.

The resistance inducing circuit 331 includes a current source 3311, two switches (PMOS transistors Mr1 and Mr2), and two compensation modules 331a, 331b. The current source 3311 is electrically connected between the supply voltage Vcc and sources of the PMOS transistors Mr1 and Mr2. The current source 3311 outputs a source current.

The two compensation modules 331a and 331b are symmetric to each other. In FIG. 3, the two compensation modules 331a and 331b are amplifier circuits providing a first amplifying parameter α. The compensation module 331a is electrically connected between the second terminal s2 with voltage VPR and gate of the PMOS transistor Mr1. Drain of the PMOS transistor Mr1 is electrically connected to the third terminal s3. The compensation module 331b is electrically connected between the first terminal s1 with voltage VPL and gate of the PMOS transistor Mr2. Drain of the PMOS transistor Mr2 is electrically connected to the fourth terminal s4.

Since the primary circuit 31 provides differential signals at the first terminal s1 and the second terminal s2, the polarity of the first voltage difference $V_1$ changes in turn. Accordingly, flowing direction of both the first current $I_1$ and the second current $I_2$ may vary. When the second current $I_2$ flows in a downward direction, the current source 3311 contributes a sub-current $I_{22}$ flowing through the PMOS transistor Mr1. When the second current $I_2$ flows in an upward direction, the current source 3311 contributes a sub-current $I_{22}$ flowing through the PMOS transistor Mr2. That is, the PMOS transistors Mr1, Mr2 are complementary conducted and the current source 3311 alternatively induces a change of the resistance at the primary circuit 31 through conduction of the PMOS transistors Mr1 and Mr2.

The inductance inducing circuit 333 includes a current source 3331, two switches (PMOS transistors MI1 and MI2), and two compensation modules 333a, 333b. The current source 3331 is electrically connected between a supply voltage Vcc and sources of the PMOS transistors MI1 and MI2. The current source 3331 outputs a source current.

Structure and connection of the two compensation modules 333a, 333b are symmetric to each other. Each of the two compensation modules 333a, 333b provides the second amplifying parameter β and a phase shift. The compensation module 333a is electrically connected between the second terminal s2 with voltage VPR and gate of the PMOS transistor MI1. Drain of the PMOS transistor MI1 is electrically connected to the third terminal s3. The compensation module 333b is electrically connected between the first terminal s1 with voltage VPL and gate of the PMOS transistor MI2. Drain of the PMOS transistor MI2 is electrically connected to the fourth terminal s4.

As mentioned above, flowing direction of the second current $I_2$ is varied with the polarity change of the primary circuit 31. When the second current $I_2$ flows in a downward direction, the current source 3331 contributes a sub-current $I_{21}$ flowing through the PMOS transistor MI1. When the second current $I_2$ flows in an upward direction, the current source 3331 contributes a sub-current $I_{21}$ flowing through the PMOS transistor MI2. That is, the PMOS transistors MI1 and MI2 are complementary conducted and the current source 3331 alternatively induces a change of the inductance of the primary inductor $L_1$ through conduction of the PMOS transistors MI1 and MI2.

With the sub-current $I_{22}$ outputted by the resistance inducing circuit 331, and the sub-current $I_{21}$ outputted by the inductance inducing circuit 333, the second current $I_2$ in FIG. 3 can be represented as summation of the two sub-currents $I_{21}$ and $I_{22}$, that is $I_2 = I_{21} + I_{22}$. Therefore, the first voltage difference $V_1$ according to equation (6) can be further conducted in equation (9).

$$V_1 = j\omega(L_1 \cdot I_1 + M \cdot I_2) \qquad \text{equation (9)}$$
$$= j\omega(L_1 \cdot I_1 \cdot M \cdot (I_{21} + I_{22}))$$

In other words, the first voltage difference $V_1$ is affected by the sub-currents $I_{21}$ and $I_{22}$, which are provided by the inductance inducing circuit 333 and the resistance inducing circuit 331. The sub-current $I_{21}$ outputted by the inductance inducing circuit 333, and the second sub-current $I_{22}$ outputted by the resistance inducing circuit 331 can be represented as equation (10).

$$\begin{cases} I_{21} = (-V_1) \cdot \frac{\beta}{j\omega} \cdot (-G_{m1}) \\ I_{22} = (-V_1) \cdot (-G_{m2}) \cdot \alpha \end{cases} \qquad \text{equation (10)}$$

The equation (10) is used to replace the sub-currents $I_{21}$, and $I_{22}$ in equation (9), and the first voltage difference $V_1$ can be further conducted as equation (11).

$$V_1 = j\omega(L_1 \cdot I_1 + M \cdot (I_{21} + I_{22})) \qquad \text{equation (11)}$$
$$= j\omega L_1 \cdot I_1 + j\omega M \cdot \left[-V_1 \cdot \frac{\beta}{j\omega} \cdot (-G_{m1}) + (-V_1) \cdot (-G_{m2}) \cdot \alpha\right]$$
$$= j\omega L_1 \cdot I_1 + V_1 \cdot [\beta \cdot M \cdot G_{m1} + j\omega \cdot M \cdot G_{m2} \cdot \alpha]$$
$$= \frac{j\omega L_1 \cdot I_1}{1 - [\beta \cdot M \cdot G_{m1} + j\omega \cdot M \cdot G_{m2} \cdot \alpha]}$$

Similarly, with the assumption $[\beta \cdot M \cdot G_{m1} + j\omega \cdot M \cdot G_{m2} \cdot \alpha] \ll 1$ the first voltage difference $V_1$ can be further simplified and represented as equation (12).

$$V_1 \approx j\omega L_1 \cdot I_1 \cdot [1 + \beta \cdot M \cdot G_{m1} + j\omega \cdot M \cdot G_{m2} \cdot \alpha] \quad \text{equation (12)}$$

$$= j\omega \cdot I_1 \cdot L_1[1 + \beta \cdot M \cdot G_{m1}] + (-\omega^2) \cdot M \cdot G_{m2} \cdot \alpha \cdot L_1 \cdot I_1$$

According to equation (12), the coefficient of the imaginary part $L_1 \cdot [1-\beta \cdot M^{10} G_{m1}]$ can be considered as the inductance looking into the primary circuit 31, and the coefficient of the real part, $(-\omega^2) \cdot M \cdot G_{m2} \cdot \alpha \cdot L_1$, is considered as the negative resistance looking into the primary circuit 31.

Since the first voltage difference $V_1$ can be represented in either equation (8) or equation (12), the coefficients of the imaginary part in both equations should be equivalent. That is, equation (13) can be conducted.

$$\kappa \cdot \omega \cdot M = \beta \cdot M \cdot G_{m1} \quad \text{equation (13)}$$

Accordingly, the second amplifying parameter β provided by the compensation modules 333a, 333b of the inductance inducing circuit 333 can be represented as $$\beta = \frac{\kappa \cdot \omega}{G_{m1}}.$$

Since the first voltage difference $V_1$ can be represented in either equation (8) of equation (12), the coefficients of the real part in both equations should be equivalent. That is, equation (14) can be conducted.

$$-\omega^2 \cdot M \cdot \gamma \cdot L_1 = (-\omega^2) \cdot M \cdot G_{m2} \cdot \alpha \cdot L_1 \quad \text{equation (14)}$$

Accordingly, the first amplifying parameter α of the compensation module 331a and 331b of the resistance inducing circuit 331 can be represented as:

$$\alpha = \frac{\gamma}{G_{m2}}.$$

Based on the above conduction, the first amplifying parameter α and the second amplifying parameter β can be properly selected and designed to compensate the electric property of the primary circuit 31. Selection of the first amplifying parameter α affects the resistance of the primary circuit 31, and the amplitude of the first voltage difference $V_1$. Selection of the second amplifying parameter β affects the inductance of the primary inductor circuit, and the non-linear capacitance of the primary circuit 31.

Depending on which electric property of the primary circuit 31 is targeted to be changed, the compensation circuit may selectively include the resistance inducing circuit 331 and/or the inductance inducing circuit 333. In a case that only resistance of the primary circuit 31 is an issue to be improved, only the resistance inducing circuit 331 is used. Similarly, in a case that only inductance of the primary circuit 31 is an issue to be improved, only the inductance inducing circuit 333 is used. In one embodiment, a plurality of resistance inducing circuits 331 with various settings of the first amplifying parameters a and/or a plurality of inductance inducing circuits 333 with various settings of the second amplifying parameter β are collaboratively used.

Figure 4:
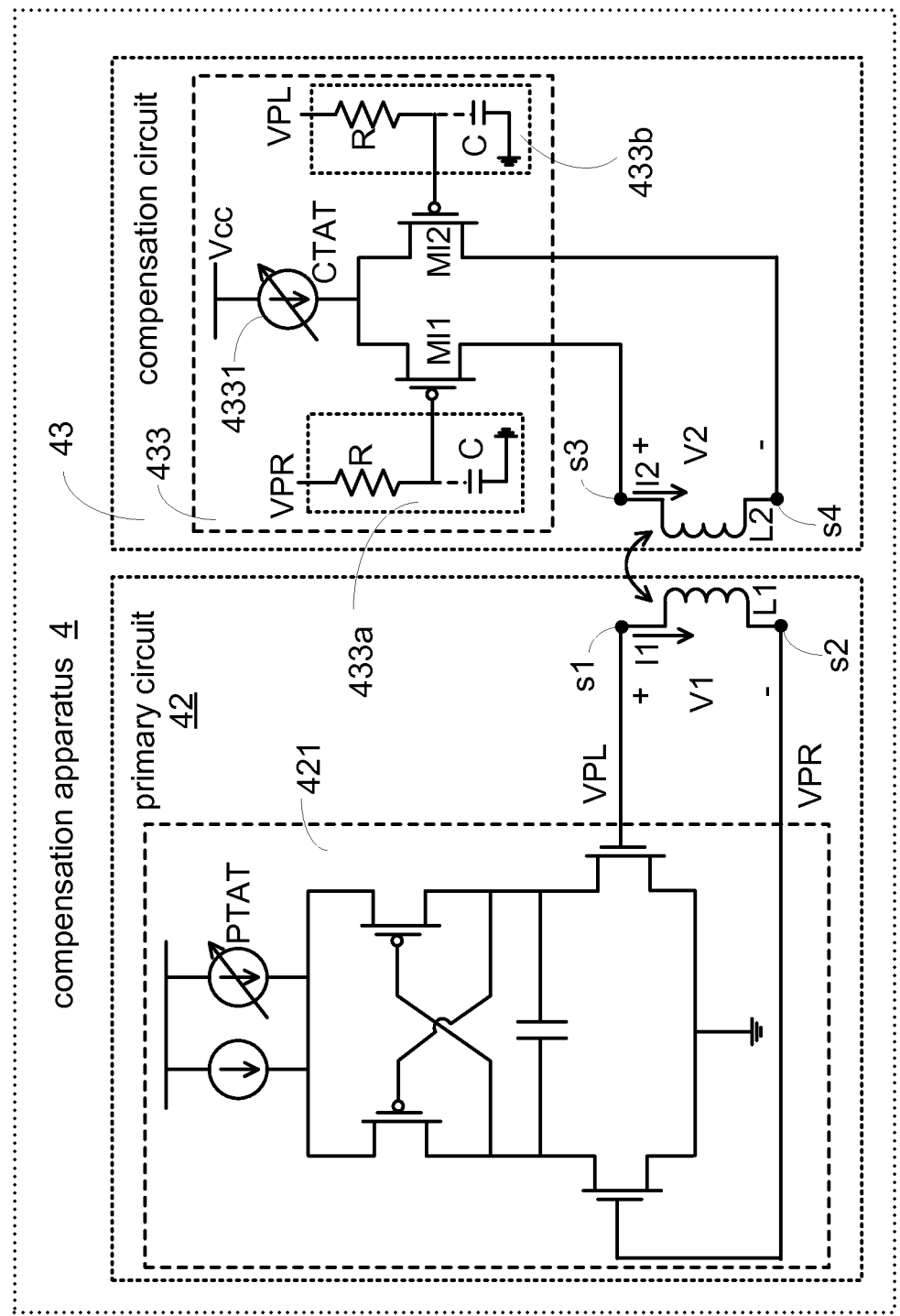
FIG. 4 is a schematic diagram illustrating the compensation circuit having only the inductance inducing circuit.

FIG. 4 is a schematic diagram of a compensation apparatus 4 according to an embodiment of the present disclosure. The compensation apparatus 4 includes a compensation circuit 43 and a primary circuit 42. In the compensation apparatus 4, the compensation circuit 43 includes the inductance inducing circuit 433 and no resistance inducing circuit.

In one embodiment, the function circuit 421 is a VCO circuit. As a differential pair used for compensating the inductance of the primary circuit 42, the inductance inducing circuit 433 includes a current source 4331, two switches (PMOS transistors MI1 and MI2), and two compensation modules 433a and 433b. The current source 4331 is electrically connected between a supply voltage Vcc and sources of the PMOS transistors MI1, MI2. The current outputted by the current source 4311 is represented as CTAT, whose current value is complementary to the absolute temperature. When the current CTAT varies, the transconductance Gm=Gm1 can be adjusted accordingly.

The structures of the compensation modules 433a and 433b are symmetric. Each of the compensation module 433a and the compensation module 433b includes a RC network, that is, a capacitor C and a resistor R.

The resistor R of the compensation module 433a is electrically connected between the second terminal s2 with voltage level VPR and gate of the PMOS transistor MI1. The capacitor C of the compensation module 433a is electrically connected between the gate of the PMOS transistor MI1 and a ground.

The resistor R of the second compensation module 433b is electrically connected between the first terminal s1 with voltage level VPL and gate of the PMOS transistor MI2. The capacitor C of the second compensation module 433b is electrically connected between the gate of the PMOS transistor MI2 and the ground.

The current source 4331 outputs a predetermined current CTAT to the compensation inductor $L_2$ through the PMOS transistors MI1, MI2, and the compensation inductor $L_2$ correspondingly induces an inductance change of the primary inductor $L_1$. Since the gate of the PMOS transistors MI1 and MI2 are controlled by the voltage level VPR and VPL of the two terminals of the primary inductor L1, the second current $I_2$ can reflect the condition of the primary circuit 42.

The second current $I_2$ in FIG. 4 can be represented shown in equation (15).

$$I_2 \approx (-V_1) * \frac{1}{j\omega CR} * (-Gm_1) = V_1 * \frac{Gm_1}{j\omega CR} \quad \text{equation (15)}$$

The first voltage difference $V_1$ at the primary circuit 42 can be represented as the following equation. Accordingly, the inductance looking into the primary circuit 42 is equivalent to $$\left(L_1 + \frac{M * Gm_1 * L_1}{CR}\right).$$

$$V_1 = j\omega(L_1 * I_1 + M * I_2) =$$

$$j\omega\left(L_1 + \frac{M * I_2}{I_1}\right)I_1 \approx j\omega I_1\left(L_1 + \frac{M * Gm_1 * L_1}{CR}\right)$$

As mentioned above, minimizing unexpected frequency drift accompanied by the temperature change is an important issue, and techniques for minimizing temperature coefficient (TC) is necessary. Instead of providing a compensation circuit having negative temperature coefficient (TC), the proposed compensation circuit actively reduces the intrinsic temperature coefficient (TC) of the primary circuit through the present disclosure. With the compensation apparatus according to the present disclosure, the oscillation frequency of the input signal provided by the primary circuit will be relatively independent of the temperature change.

Figure 5:
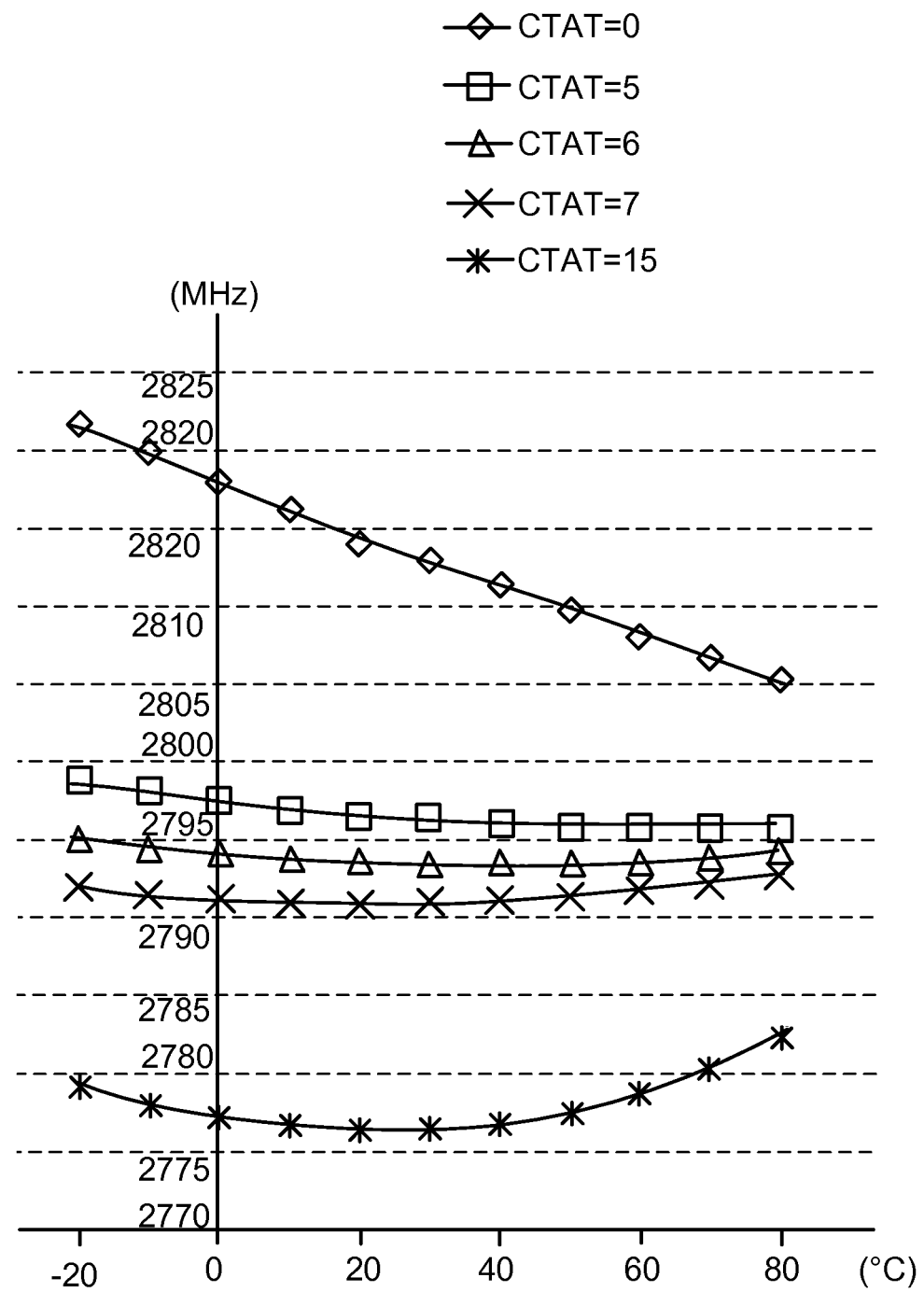
FIG. 5 is a schematic diagram illustrating the frequency variations of the VCO circuit in FIG. 4 with temperature drifts between −20 to 80° C.

FIG. 5 is a schematic diagram illustrating the frequency variations of the VCO circuit in FIG. 4 with temperature drifts between −20 to 80° C. The vertical axis represents the frequency in MHz and the horizontal axis represents the temperature change. In FIG. 5, the frequency is a function of temperature for a fixed reference input voltage.

Referring to FIG. 5, in a case that no predetermined compensation current is outputted by the current source 4331 (that is, the curve annotated with CTAT=0), the oscillation frequency of the VCO circuit drifts from 2820 MHz to 2805 MHz within a range of temperature −20 to 80° C. After normalization and conversion, the temperature coefficient TC associated with the VCO circuit is represented as 59 ppm/° C. within the range −20 to 80° C.

As shown in FIG. 5, the slope of the curves decreases when the current source 4331 outputs the predetermined compensation current CTAT. With proper setting of CTAT, the frequency drift of the first voltage difference $V_1$ decreases and the oscillation frequency stability of the first voltage difference $V_1$ can be improved. In practical applications, the range of the predetermined current may vary between several μA to mA.

For example, the curves corresponding to CTAT=5, 6 or 7 μA are relatively flat in FIG. 5, meaning that the output frequency deviation of curves corresponding to the current source 4331 outputting current value of 5, 6 or 7 mA are flatter. In other words, after the compensation circuit is used, the temperature coefficient of the primary circuit is relatively close to a constant.

When the predetermined compensation current CTAT is 5 μA, the frequency of the first voltage difference $V_1$ drifts between 2800 MHz to 2975 MHz. When the predetermined compensation current CTAT is 6 μA, the frequency of the first voltage difference $V_1$ drifts between 2795 MHz to 2793 MHz. When the predetermined compensation current CTAT is 7 μA, the frequency of the first voltage difference $V_1$ drifts between 2793 MHz to 2792 MHz. When the predetermined compensation current CTAT is 15 μA, the frequency of the first voltage difference $V_1$ roughly drifts in between 2783 MHz to 2776 MHz.

In conclusion, once the current source 4331 in FIG. 4 outputs a predetermined compensation current, the variance range of the frequency of the primary circuit is reduced. Consequentially, the VCO circuit with the inductance inducing circuit becomes more robust to temperature variation.

Figure 6:
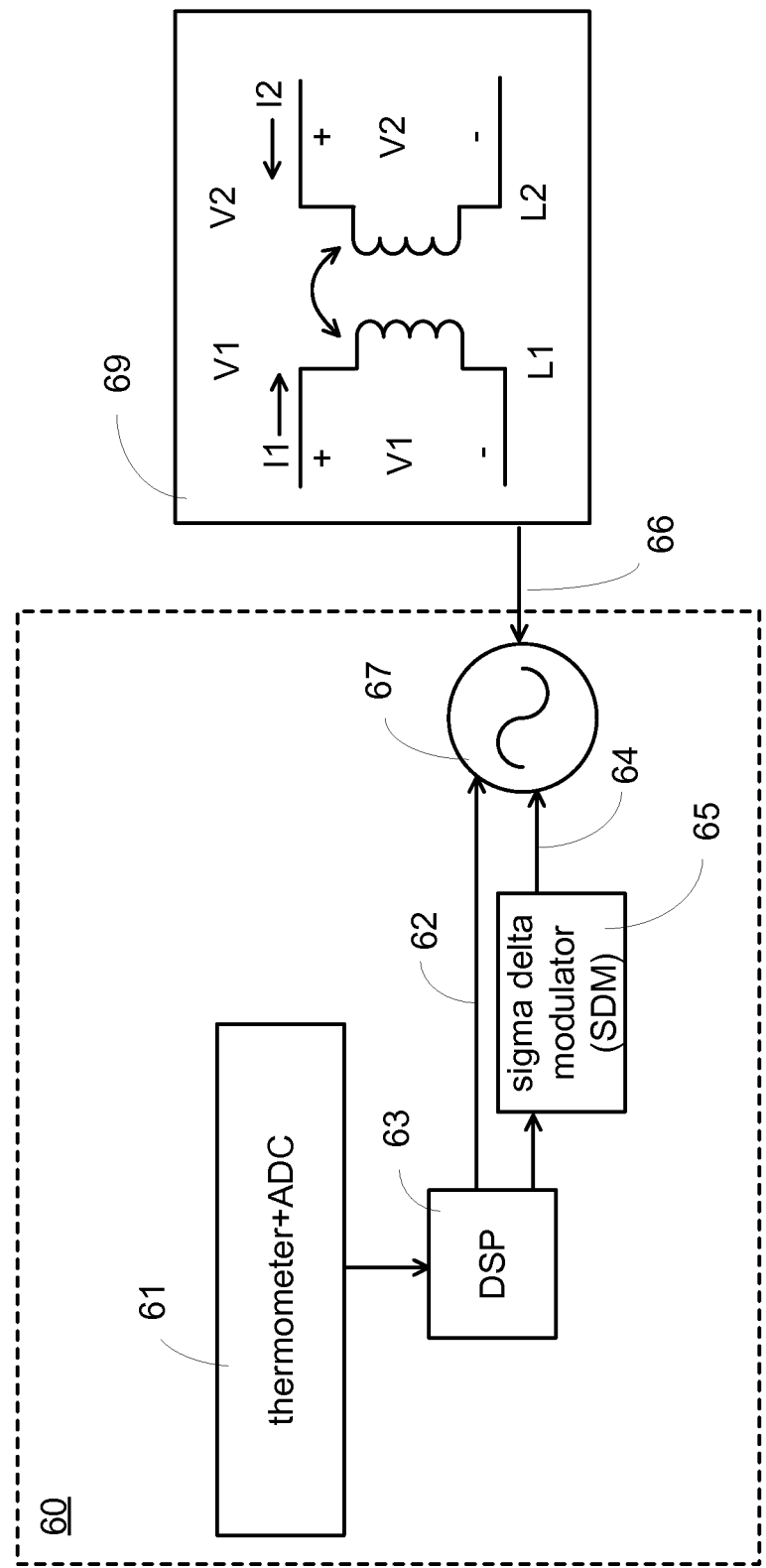
FIG. 6 is a schematic diagram illustrating the application to a digitally controlled oscillator.

In one embodiment, the primary circuit can be an output of an oscillator, an output of voltage-controlled oscillator (VCO), or an output of digitally controlled oscillator (DCO). FIG. 6 is a schematic diagram illustrating the application to a function circuit including a digitally controlled oscillator. The function circuit 60 includes a thermometer and an analog-to-digital converter (ADC) 61, a DSP 63, a sigma delta modulator (hereinafter, SDM) 65 and the DCO 67. The thermometer and ADC 61 are coupled to the DSP 63. The DSP 63 is coupled to the SDM 65 and the DCO 67. The DSP 63 and the SDM 65 use switched capacitors (not shown) to fine tune the output of the DCO 67 respectively through a first fine tune path 62, and a second fine tune path 64. The output of the DCO 67 can be compensated by an inductor-based apparatus 69. Details of which are not illustrated to avoid redundancy.

The proposed compensation circuit induces a change of resistance and/or inductance at the primary circuit. With such change of resistance and/or inductance, the temperature coefficient of the primary circuit is accordingly reduced, and the compensation circuit according to the present disclosure is capable of reducing the temperature coefficient. In other words, the compensation circuit adjusts the temperature coefficient of the primary circuit.

Depending on the required accuracy of the frequency drift, the temperature compensation circuit of the present disclosure may be used alone, or collaboratively used with other temperature compensation circuits. In some situations, the frequency deviation of the primary circuit is acceptable after the usage of the temperature compensation circuit according to the present disclosure. Thus, only the temperature compensation circuit according to the present disclosure needs to be adopted.

In some situations that a more limited deviation of the frequency drift is required, the present disclosure is capable of providing a coarse adjustment of the temperature coefficient, and fine adjustment of temperature coefficient can be collaboratively provided by other types of temperature coefficient compensation circuit. With the compensation circuit of the present disclosure, the temperature coefficient of the primary circuit has been shrunk. Therefore, even if the previously mentioned varactor based temperature compensation circuits need to be used together, the extra area occupied by the varactors can be accordingly reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A compensation apparatus, comprising:
a primary circuit, for providing a first voltage, a second voltage, and a first current, comprising:
a function circuit, for generating an input signal; and
a first inductor, coupled between a first terminal with the first voltage and a second terminal with the second voltage, wherein the first current flows through the first inductor; and
a compensation circuit, comprising:
a second inductor, coupled between a third terminal with a third voltage and a fourth terminal with a fourth voltage, wherein a second current flowing through the second inductor is related to the first current; and
a current source circuit, for outputting the second current to compensate frequency drift of the input signal, wherein the primary circuit and the compensation circuit are coupled via the first inductor and the second inductor.

2. The compensation apparatus according to claim 1, wherein the function circuit comprises:
an oscillator, for outputting the input signal.

3. The compensation apparatus according to claim 1, wherein the current source circuit comprises:
a first inducing circuit, for changing inductance of the function circuit by providing a first sub-current.

4. The compensation apparatus according to claim 3, wherein the first inducing circuit comprises:
a first current source, for outputting a first source current;
a first switch, coupled to the first current source and the third terminal; and
a second switch, coupled to the first current source and the fourth terminal,
wherein the first switch and the second switch receive the first source current and outputs the first sub-current to contribute the second current.

5. The compensation apparatus according to claim 4, wherein the first inducing circuit further comprises:
a first compensation module, coupled to the second terminal; and
a second compensation module, coupled to the first terminal,
wherein the first compensation module and the second compensation module adjust the first sub-current to contribute the second current.

6. The compensation apparatus according to claim 5, wherein the first compensation module and the second compensation module are symmetric in structures.

7. The compensation apparatus according to claim 5, wherein at least one of the first and second compensation modules comprise:
a first resistor, coupled to the second terminal and the first switch; and
a first capacitor, coupled to the first switch and a ground voltage.

8. The compensation apparatus according to claim 1, wherein the current source circuit comprises:
a second inducing circuit, for changing resistance of the function circuit by providing a second sub-current.

9. The compensation apparatus according to claim 8, wherein the second inducing circuit comprises:
a second current source, for outputting a second source current;
a first switch, coupled to the second current source and the third terminal; and
a second switch, coupled to the second current source and the fourth terminal,
wherein the first switch and the second switch receive the second source current and outputs the second sub-current to contribute the second current.

10. The compensation apparatus according to claim 9, wherein the second inducing circuit further comprises:
a first compensation module, coupled to the second terminal; and
a second compensation module, coupled to the first terminal, wherein the first compensation module and the second compensation module adjust the second sub-current to contribute the second current.

11. The compensation apparatus according to claim 10, wherein the first compensation module and the second compensation module are symmetric in structures.

12. An inductor-based apparatus, for receiving an input signal from a function circuit, comprising:
a first inductor, coupled to the function circuit through a first terminal with a first voltage and a second terminal with a second voltage, wherein a first current flows through the first inductor;
a second inductor, coupled between a third terminal with a third voltage and a fourth terminal with a fourth voltage, wherein a second current flowing through the second inductor is related to the first current; and
a current source circuit, for outputting the second current to compensate frequency drift of the input signal.

13. The inductor-based apparatus according to claim 12, wherein the function circuit comprises at least one of a digitally controlled oscillator (DCO) and a voltage-controlled oscillator (VCO).

14. The inductor-based apparatus according to claim 12, wherein the current source circuit comprises:
a first inducing circuit, for changing inductance of the function circuit by providing a first sub-current.

15. The inductor-based apparatus according to claim 14, wherein the first inducing circuit comprises:
a first current source, for outputting a first source current;
a first switch, coupled to the first current source and the third terminal; and
a second switch, coupled to the first current source and the fourth terminal,
wherein the first switch and the second switch receive the first source current and outputs the first sub-current to contribute the second current.

16. The inductor-based apparatus according to claim 15, wherein the first inducing circuit further comprises:
a first compensation module, coupled to the second terminal; and
a second compensation module, coupled to the first terminal,
wherein the first compensation module and the second compensation module adjust the first sub-current to contribute the second current.

17. The inductor-based apparatus according to claim 16, wherein at least one of the first and second compensation modules comprise:
a first resistor, coupled to the second terminal and the first switch; and
a first capacitor, coupled to the first switch and a ground voltage.

18. The inductor-based apparatus according to claim 12, wherein the current source circuit comprises:
a second inducing circuit, for changing resistance of the function circuit by providing a second sub-current.

19. The inductor-based apparatus according to claim 18, wherein the second inducing circuit comprises:
a second current source, for outputting a second source current;
a first switch, coupled to the second current source and the third terminal; and
a second switch, coupled to the second current source and the fourth terminal,
wherein the first switch and the second switch receive the second source current and outputs the second sub-current to contribute the second current.

20. The inductor-based apparatus according to claim 19, wherein the second inducing circuit further comprises:
a first compensation module, coupled to the second terminal; and
a second compensation module, coupled to the first terminal, wherein the first compensation module and the second compensation module adjust the second sub-current to contribute the second current.

21. A compensation apparatus, comprising:
a primary circuit, for providing a first voltage difference and a first current, comprising:
a function circuit, for generating an input signal; and
a first inductor, coupled to the function circuit, wherein the first current flows through the first inductor; and
a compensation circuit, comprising:
a second inductor, wherein a second current flowing through the second inductor is related to the first voltage difference; and
a current source circuit, for outputting the second current to compensate frequency drift of the input signal,
wherein the primary circuit and the compensation circuit are coupled via the first inductor and the second inductor.

22. The compensation apparatus according to claim 21, wherein the function circuit comprises:
an oscillator, for outputting the input signal.

23. The compensation apparatus according to claim 21, wherein the current source circuit comprises:

a first inducing circuit, for changing an electric property of the function circuit by providing a first sub-current, wherein the first inducing circuit comprises:

a first current source, for outputting a first source current;

a first switch, coupled to the first current source and a terminal of the second inductor; and a second switch, coupled to the first current source and another terminal of the second inductor, wherein the first switch and the second switch receive the first source current and outputs the first sub-current to contribute the second current.

24. The compensation apparatus according to claim 23, wherein the first inducing circuit further comprises:

a first compensation module, coupled to a terminal of the first inductor; and a second compensation module, coupled to another terminal of the first inductor, wherein the first compensation module and the second compensation module adjust the first sub-current to contribute the second current.

25. The compensation apparatus according to claim 23, wherein the electric property is an inductance or a resistance of the function circuit.

\* \* \* \* \*